United States Patent [19]

Adams et al.

[11] Patent Number: 4,694,451
[45] Date of Patent: Sep. 15, 1987

[54] ADAPTIVE DIGITAL FILTER

[75] Inventors: Peter F. Adams, Ipswich, England; Colin F. N. Cowan, Edinburgh, Scotland

[73] Assignee: British Telecommunications public limited company, Great Britain

[21] Appl. No.: 690,193

[22] Filed: Jan. 10, 1985

[30] Foreign Application Priority Data

Jan. 12, 1984 [GB] United Kingdom ................ 8400791

[51] Int. Cl.$^4$ ........................ H04J 15/00; H03H 7/30; G06F 7/38
[52] U.S. Cl. .................................... 370/32.1; 355/14; 364/724; 379/411
[58] Field of Search ............................ 375/14; 370/32; 379/411; 364/724

[56] References Cited

U.S. PATENT DOCUMENTS 3,777,130 12/1973 Croisier et al. ................ 364/724
4,146,931 3/1979 Delforge .......................... 364/724
4,435,823 3/1984 Davis et al. .................... 375/14

OTHER PUBLICATIONS

"A Digital Transmission Unit for the Local Network", by P. J. Van Gerwen et al, *Conference on Communications Equipment and Systems*, pp. 65-69, 20-22 Apr. 1982.
"Versatile Digital Arithmetic Unit with Rams", by M. A. Bin Nun, *Electronic Engineering*, vol. 48, No. 580, pp. 18-19, Jun. 1976.

Primary Examiner—Douglas W. Olms
Assistant Examiner—Frank M. Scutch, III
Attorney, Agent, or Firm—Nixon & Vanderhye

[57] ABSTRACT

A digital filter comprises a plurality of delay stages 41 such as shift register stages through which an input x(t) is fed. Each of a plurality of individually addressable random access memories 42 is addressed by the output of one of the delay stages and the output from the RAMs 42 are combined. An error signal adapts the values stored within the RAMs. The filter may also be extended such that each RAM receives an address input from more than one delay stage.

6 Claims, 6 Drawing Figures

ADAPTIVE DIGITAL FILTER

BACKGROUND OF THE INVENTION

This invention relates to the field of digital filtering.

Filters have been used in signal processing systems for many years. In general such filters have been linear filters since they are better understood and easier to implement. The introduction of digital signal processing has however produced a requirement for filters having non-linear characteristics since, for example, digital to analogue converters and analogue to digital converters introduce non-linearities which may only be overcome either by increasingly sophisticated converter designs or by the use of non-linear filters to compensate for such effects.

A major advantage of digital filters is that they may be adaptive—that is to say their filtering characteristics may be adapted in response to an error signal. A digital filter may model a transmission circuit even if the operating characteristics of the transmission are not fully known. However the filter model is made more complicated if the transmission circuit includes non-linear elements. More difficulties arise if the complete circuit also includes linear dispersions—ie linear circuits which require memory in the filter model. The present invention is therefore concerned with a digital filter which models a transmission circuit consisting of a non-linear no-memory element followed by a linear dispersion.

It is known to model a non-linear element followed by linear dispersion by means of a large memory with an associated shift register. The memory has stored therein a plurality of precalculated output values and the outputs from the shift register stages are used to address appropriate memory locations to produce the required output. This type of arrangement is suitable with a relatively small memory but becomes impractical when a large memory is required. A further disadvantage of such a model is that an adaptive filter of this type takes much longer to adapt than a linear transversal filter.

A second known approach is to model the non-linearity as a memory look up table and then supply the output of the look up table to a linear transversal filter. Such a filter would adapt quickly but the values stored within the memory would require many bits in order to accurately represent the output of the non-linearity. This is not difficult in itself but it would require the linear transversal filter to perform multiplications with very large numbers.

SUMMARY OF THE INVENTION

According to one aspect of the present invention there is provided a digital filter comprising a plurality of delay stages through which an input signal is fed successively; a plurality of individually addressable random access memories, each of which is addressable by the output of one of said delay stages; means for combining the outputs read from said random access memories; and means for providing an error signal for adapting the values stored within said random access memories.

Preferably the digital filter also includes a random access memory which receives the input signal directly without being delayed.

The digital filter may be modified to model a linear dispersion preceding the non-linearity. In a preferred embodiment of such a filter each random access memory may be addressed by the output from more than one of said delay stages. Preferably each memory receives the output from the same number of delay stages, and said stages supplying a memory are adjacent stages.

According to a second aspect of the present invention there is provided a transmitter/receiver unit including a digital filter according to said first aspect in which said filter forms an echo copy signal for cancelling noise at the receiver due to an output from the transmitter.

Preferably each random access memory of the digital filter in said unit is addressed by a plurality of adjacent delay stages.

BRIEF DESCRIPTION OF THE DRAWINGS

The invention will be described now by way of example only with particular reference to the accompanying drawings. In the drawings.

DESCRIPTION OF THE PREFERRED EMBODIMENTS

Figure 1:
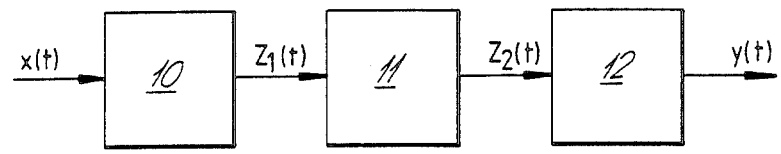
FIG. 1 is a block schematic diagram of a transmission circuit including a no memorry non-linear element.

A transmission circuit is shown in FIG. 1 which is to be modelled by means of an adaptive linear filter. The output from the filter will be subtracted from the output of the transmission circuit to produce an error signal. The digital filter will then adapt in order to reduce the mean square value of the error signal.

A time varying signal x(t) is supplied to a linear dispersive element 10 producing a time varying signal $Z_1(t)$. This is supplied to a non-linear no memory element 11 producing an output $Z_2(t)$. The output $Z_2(t)$ from the non-linear element 11 is supplied to a second linear dispersive element 12 which produces an output y(t).

A practical example of a circuit which may be represented by this model is a data modem providing full duplex data transmission over a two wire analogue link. Such a modem is shown schematically in FIG. 2. The first linear dispersive element 10 is a digital filter consisting of a subtraction circuit 20 having a positive input which receives each data symbol, and a negative input which receives each data symbol via a unit delay device 21. The non-linearity 11 is introduced by a digital to analogue converter 22, and the second linear dispersion 12 is introduced by a four wire to two wire hybrid 23 and a transmission line 24. The system further includes an echo canceller 25 which must model noise on an input path 26 due to the transmission of a modulated output. The echo canceller consists of a digital filter which is adaptive and receives an error signal from a subtraction circuit 27.

Returning to our general system of FIG. 1 it is known that the non-linear system cannot be modelled by means of a linear transversal filter and that some form of memory look up table will be required. The filter is also required to be adaptive therefore the look up table is implemented as random access memory. A first approach would be to implement the whole system as a large random access memory (RAM) with an associated shift register. However the RAM becomes very large if the linear dispersions include many delay elements.

Figure 3:
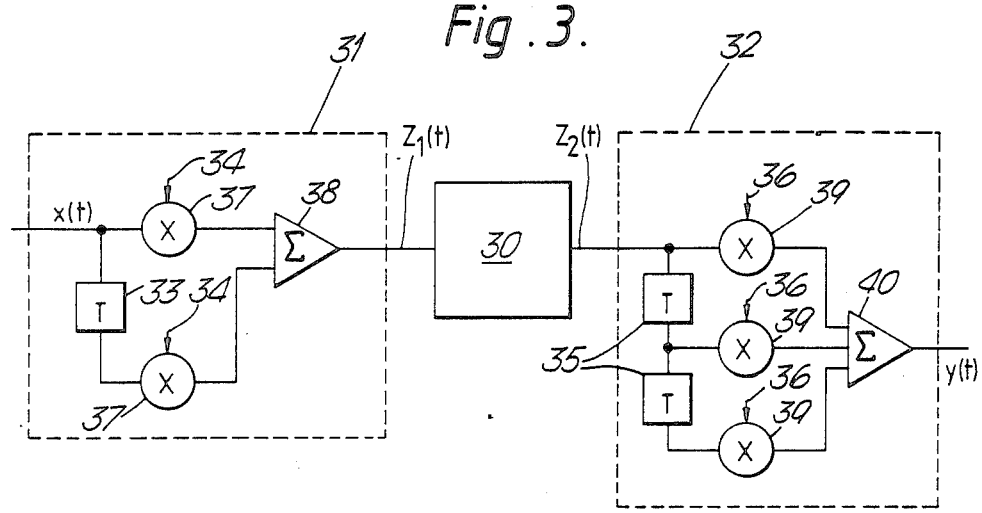
FIG. 3 is a digital filter for modelling the modem of FIG. 2.

An alternative model is shown in FIG. 3 in which only the non-linearity has been modelled by means of a RAM 30, the first linear dispersion 10 has been modelled as a transversal linear filter 31, and the second linear dispersion 12 has also been modelled as a transversal linear filter 32. Filter 31 has one delay 33 (and therefore two coefficients 34) and filter 32 has two delays 35 (and therefore three coefficients 36) but the actual number of delays in a practical system will depend on the system which is being modelled. The product of input values x(t), and x(t−T) and coefficients 34 are formed by multipliers 37 in filter 31. These products are then added by a summation circuit 38 to provide an address $Z_1(t)$ to the RAM 30. It should be noted that transmission lines shown in FIG. 3 are busses which carry a plurality of bits. In filter 32 the products of the delayed inputs $Z_2(t)$ and the coefficients 36 are formed by multipliers 39 and added by a summation circuit 40. The problems associated with the system shown in FIG. 3 is that the output $Z_2(t)$ from the RAM 30 includes many bits in order to accurately represent values produced by the non-linearity. As a result of this the multipliers 39 have to multiply very large numbers.

The output from the RAM 30 is $Z_2(t)$ which is dependent on the instantaneous value of $Z_1(t)$ and related thereto by a non-linear function such that:

$$Z_2(t) = g[Z_1(t)]$$

The output y(t) is a linear function f of $Z_2(t)$, $Z_2(t-T)$, $Z_2(t-2T)$ where T is the duration of a unit delay, 35. Therefore:

$$y(t) = f[Z_2(t), Z_2(t-T), Z_2(t-2T)]$$

However f is a linear function therefore this may be written as $$y(t) = f_1[Z_2(t)] + f_2[Z_2(t-T)] + f_3[Z_2(t-2T)]$$

where $f_1$, $f_2$ and $f_3$ are different linear functions. We may then substitute to give y(t) in terms of $Z_1(t)$ such that:

$$y(t) = f_1[g(Z_1(t))] + f_2[g(Z_1(t-T))] + f_3[g(Z_1(t-2T))]$$

The linear and non-linear function may then be combined to give a series of non-linear functions such that $$y(t) = g_1(Z_1(t)) + g_2(Z_1(t-T)) + g_3(Z_1(t-2T))$$

Figure 4:
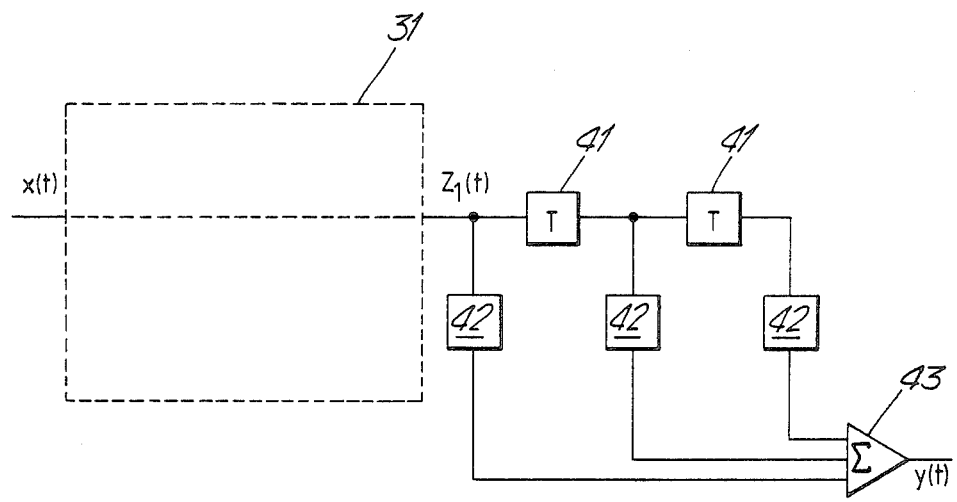
FIG. 4 is an improved digital filter.

The structure shown in FIG. 3 may therefore be replaced by the structure shown in FIG. 4. Each tap of a transversal filter consisting of delays 41 provides the address to a RAM 42. The output from each RAM is then added by a summation circuit 43. Each RAM 42 is similar to the RAM 30 in FIG. 3 but multipliers 39 have been removed.

The output from filter 31 is $Z_1(t)$ which may be expressed in terms of x(t) thus $$Z_1(t) = f[x(t), x(t-T)]$$

where f is a linear function such that $$Z_1(t) = f_1(x(t)) + f_2(x(t-T))$$

This may then be substituted into the equation for y(t) such that:

$$y(t) = g_1[f_1(x(t)) + f_2(x(t-T))] +$$
$$g_2[f_1(x(t-T)) + f_2(x(t-2T))] +$$
$$g_3[f_1(x(t-2T)) + f_2(x(t-3T))]$$

From this we may define new non-linear functions of two variables, thus $$y(t) = g_4[x(t), x(t-T)] + g_5[x(t-T), x(t-2T)] +$$
$$g_6[x(t-2T), x(t-3T)]$$

Figure 5:
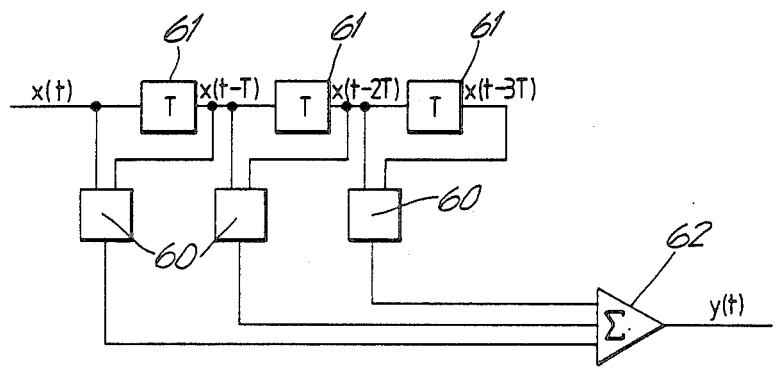
FIG. 5 is a further improved digital filter.
Figure 6:
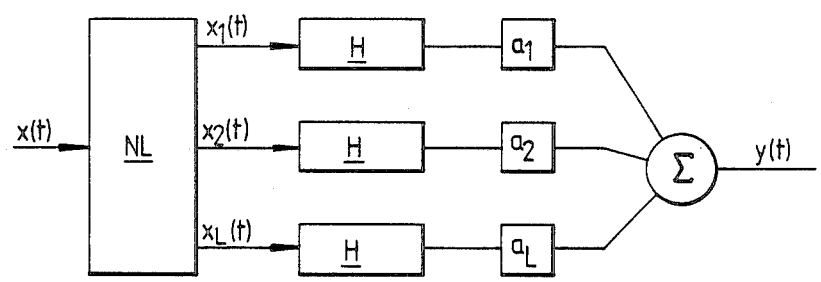
FIG. 6 is a block diagram illustrating the principle of the digital filter of FIG. 4.

This leads to the structure shown in FIG. 6 in which the size of each RAM has been increased but the multipliers have been removed. Each RAM 60 receives the output from two delay devices 61. The output from all of the RAMs 60 are then supplied to a summation circuit 62. The model of FIG. 5 may be compared with that of FIG. 3. The number of inputs to each RAM 60 is equal to the number of coefficients 34 in filter 31. The number of delays 61 is based on the number of delays 35 in filter 32. It should be noted that the number of bits supplied to each RAM 42 or each RAM 60 is dependent on the information content of x(t) and not the number of bits required to accurately represent the non linearity.

The model shown in FIG. 1 may also be analysed as follows: A quantised input signal x(t) is represented:

$$Z(t) = \sum_{i=1}^{L} a_i x_i(t) \qquad (1)$$

where for any time t one and only one of the $x_i(t)$ is non zero and where the coefficient $a_i$ represents an arbitary non-linearity acting on the quantized signal. The non-linearity is simply determined as an amplitude dependent gain term. The final output then becomes $$y(t) = \sum_t h(T) \cdot \sum_{x=1}^{L} \cdot a_i x_i(t-T) \qquad (2)$$

This can be expressed as:

$$y(t) = [h_1 h_2 \ldots h_N] \begin{bmatrix} x_1(t) \ldots x_L(t) \\ x_1(t-1) \\ z_1(t-N+1) x_L(t-N+1) \end{bmatrix} \begin{bmatrix} a_1 \\ a_2 \\ a_L \end{bmatrix} \qquad (3)$$

$$= \underline{H}^T(\underline{X} \underline{A})$$

In FIG. 3 the product (XA) is formed first but there is no reason why the product ($H^TX$) should not be formed first so that an arrangement of the form shown in FIG. 6 would result. In this case the $a_i$ coefficients may then be incorporated into the linear H vectors on each channel of the model. It will be seen that the non-linearity NL in this case is a decoder for a memory cell selection circuit and it can further be seen that each weight in the filter bank of FIG. 4 is a memory look-up. This it will be seen that the memory look-ups are provided by the RAM's of FIG. 1 and the appropriate output results by combining the outputs read out from each RAM according to the location which is addressed by the output of each of the delay stages 10.

Figure 2:
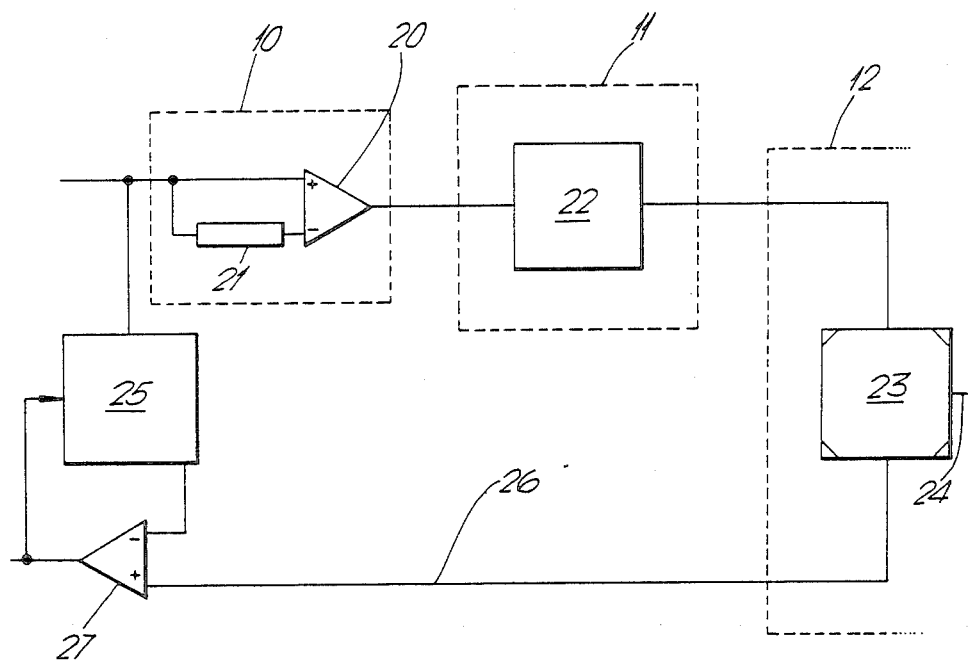
FIG. 2 is a block diagram of a data modem.

The above analysis can be extended to the general block model which was illustrated in FIG. 2 of the drawings.

In this case the output y(t) is given by:

$$y(t) = \sum_i h_i g\left(\sum_j^M x(t - 1 - j)w_j\right) \quad (4)$$

where g(.) is an undefined non-linear function. Equation (4) may be decomposed in the following way for the specific case of M=2.

$$y(t) = h_1 g(w_1 x(t) + w_2 x(t - 1)) +$$

$$h_2 g(w_1 x(t - 1) + w_2 x(t - 2)) +$$

.
.
.

$$h_W g(w_1 x(t - N + 1) + w_2 x(t - N))$$

In this case the vector X(t) (Equation 3) may be made up from a set of orthogonal signal levels generated by x(t), x(t−1) such that:

$$x_1(t,t - 1) \; x_1(t - 1, t - 2) \ldots x_1(t - N + 1, t - N)$$

$$\underline{X^T(t)} = x_2(t, t - 1) \ldots$$

$$x_L(t, t - 1) \ldots x_L(t - N + 1), t - N)$$

the levels $x_1(t,t-1)$ etc. are simply the addresses generated by taking all the bits from x(t) and x(t−1) together. The non-linearity in the system is then represented by coefficients $a_i$ which multiply each $x_i(.)$. If we define a vector B such that:

$$B^T = (b_1 b_2 \ldots b_L)$$

and $b_i$ is some combination of the non-linear coefficients $a_i$ and the linear dispersion coefficients $w_1$ and $2_2$.

$$y(t) = B^T X^T(t) H \quad (5)$$

From this equation it is possible to see that a filter which operates in accordance with this relationship takes the form shown in FIG. 5.

What is claimed is:

1. A digital filter comprising:
    a plurality of delay stages for receiving, delaying and then outputting an input digital signal,
    a plurality of individually addressable random access memory devices for storing respective data values therein,
    means for addressing and accessing stored data values in each of said memory devices, said means for addressing and accessing each said memory device being connected to receive the output from at least two of said delay stages,
    means for combining the thus addressed outputs read from said memory devices to provide a filter output signal, and
    means for processing the filter output signal to provide an error signal which may be used to adapt the data values stored within said memory devices so as to minimize said error signal.

2. A digital filter according to claim 1 in which each memory device is addressed by the output from the same number of delay stages.

3. A digital filter according to claim 1 in which each memory device is addressed by the output from adjacent delay stages.

4. A transmitter/receiver unit including a digital filter according to claim 1 in which said filter output signal forms an echo copy signal for cancelling noise at the receiver due to an output from the transmitter.

5. A transmitter/receiver unit according to claim 4 wherein each random access memory of the digital filter is addressed by a plurality of adjacent delay stages.

6. A digital filtering method comprising the steps of:
    receiving a digital input signal x(t) and delaying it to provide a succession of delayed versions thereof x(t−T), x(t−2T), x(t−3T) ..., where T is a predetermined time period,
    using at least two of such signals x(t), x(t−T), x(T−2T), x(t−3T) ... to address stored data values in RAM and to provide a plurality of addressed RAM outputs; and
    combining said addressed RAM outputs to provide a digitally filtered output representation y(t) of said input signal x(t).

* * * * *

UNITED STATES PATENT AND TRADEMARK OFFICE
CERTIFICATE OF CORRECTION

PATENT NO. : 4,694,451
DATED : 15 September 1987
INVENTOR(S) : Peter F. Adams

It is certified that error appears in the above-identified patent and that said Letters Patent is hereby corrected as shown below:

Column 2, line 17, change "memorry" to --memory--.

Column 3, line 8, change "coeifficients" to --coefficients--.

Column 5, line 24, change the subscript "w" to --n--.

Column 5, line 32, delete the underlining of "x".

Column 5, line 45, change "$2_2$" to --$w_2$--.

Signed and Sealed this

Nineteenth Day of April, 1988

Attest:

DONALD J. QUIGG

Attesting Officer  Commissioner of Patents and Trademarks